(12) United States Patent
Ouzillou et al.

(10) Patent No.: US 7,751,783 B2
(45) Date of Patent: *Jul. 6, 2010

(54) POWER AMPLIFIER PROTECTION CIRCUIT AND ASSOCIATED METHODS

(75) Inventors: Mendy M. Ouzillou, Austin, TX (US); Ryan M. Bocock, Austin, TX (US)

(73) Assignee: Black Sand Technologies, Inc., Austin, TX (US)

( * ) Notice: Subject to any disclaimer, the term of this patent is extended or adjusted under 35 U.S.C. 154(b) by 185 days.

This patent is subject to a terminal disclaimer.

(21) Appl. No.: 10/880,961

(22) Filed: Jun. 30, 2004

(65) Prior Publication Data

US 2006/0003711 A1    Jan. 5, 2006

(51) Int. Cl.
*H03C 1/62* (2006.01)

(52) U.S. Cl. .................. 455/115.1; 455/127.1; 375/297

(58) Field of Classification Search .............. 455/115.1, 455/115.4, 127.1, 127.2, 127.3, 114.3; 330/262, 330/263, 266, 267; 375/297
See application file for complete search history.

(56) References Cited

U.S. PATENT DOCUMENTS

| | | | | | |
|---|---|---|---|---|---|
| 3,641,451 | A | * | 2/1972 | Hollingsworth et al. | 330/134 |
| 5,249,141 | A | * | 9/1993 | Vandebroek et al. | 702/132 |
| 5,813,301 | A | * | 9/1998 | Fujita | 83/140 |
| 5,818,301 | A | | 10/1998 | Higashiyama et al. | |
| 5,942,945 | A | * | 8/1999 | Eriksson | 330/298 |
| 5,949,085 | A | | 9/1999 | Barrett | |
| 6,011,690 | A | | 1/2000 | Hughes et al. | |
| 6,169,884 | B1 | * | 1/2001 | Funk | 455/522 |
| 6,229,995 | B1 | * | 5/2001 | Lee | 455/127.2 |
| 6,255,903 | B1 | | 7/2001 | Leffel | |
| 6,359,504 | B1 | * | 3/2002 | Cozzarelli | 330/51 |
| 6,462,620 | B1 | | 10/2002 | Dupuis et al. | |
| 6,549,071 | B1 | | 4/2003 | Paul et al. | |
| 6,727,754 | B2 | | 4/2004 | Dupuis et al. | |
| 6,828,859 | B2 | | 12/2004 | Dupuis et al. | |
| 6,882,861 | B2 | * | 4/2005 | Panasik et al. | 455/553.1 |
| 7,167,045 | B1 | | 1/2007 | Son et al. | |
| 7,268,990 | B1 | * | 9/2007 | Loeb et al. | 361/54 |
| 2005/0227631 | A1 | * | 10/2005 | Robinett | 455/83 |

OTHER PUBLICATIONS

Scuderi et al., "A High Performance RF Power Amplifier with protection against load mismatches", IEEE Microwave Symposium Digest, vol. 2, Jun. 8-13, 2003, pp. 699-702.
Lasanen, K., "Design of a 1-V Low Power CMOS Bandgap Reference Based on Resistive Subdivision", University of Oulu, Department of Electrical Engineering and Infotech Oulu, 2002, pp. III-564-III-567.

* cited by examiner

*Primary Examiner*—Nhan Le
(74) *Attorney, Agent, or Firm*—Johnson & Associates

(57) ABSTRACT

In a power amplifier, techniques are provided for protecting the power amplifier from temperature extremes resulting from conditions such as load mismatches. After sensing the temperature of the power amplifier, the operation of the RF power amplifier is controlled accordingly. In one example, the power amplifier is shut down when the sensed temperature reaches a threshold value, which can be set to a value just below the point where permanent damage would occur. In another example, when a threshold temperature is reached, the operation of the power amplifier is changed, to prevent the temperature of the power amplifier from rising to a level that would damage the power amplifier.

31 Claims, 5 Drawing Sheets

POWER AMPLIFIER PROTECTION CIRCUIT AND ASSOCIATED METHODS

FIELD OF THE INVENTION

This invention relates to the field of power amplifiers. In particular, this invention is drawn to techniques for protecting power amplifiers from damage, such as damage from high temperatures.

BACKGROUND OF THE INVENTION

Power amplifiers are susceptible to damage when subjected to extreme conditions such as high temperatures. High temperatures can have various causes, including extreme current due to mismatched loads at the antenna, high duty cycle from data transmission, battery regulation when recharging a battery, or high ambient temperatures.

A typical RF power amplifier can be specified to handle load mismatches on the order of a 10:1 ratio. A mismatch of 10:1 implies that a power amplifier must drive loads of 5 ohms to 500 ohms. Nominally, the RF amplifier is specified is specified to drive a 50 ohm load. At the extremes of these mismatched conditions, a power amplifier, regardless of which process technology has been implemented, could experience stresses that have the potential to cause permanent damage to the power amplifier.

In a power amplifier implemented using a complementary metal oxide semiconductor (CMOS), when the load impedance at the antenna is high (e.g., 500 ohms), the node voltages could exceed the CMOS breakdown voltage and cause permanent damage. When the load impedance of a load is low (e.g., 5 ohms), the current supplied to the load may be high enough to result in thermal problems. This invention addresses the problems associated with thermal issues.

Some prior art power amplifiers use current sensors to prevent the power amplifiers from supplying too much current to a load. In one example, current is sensed external to the power amplifier, and the power amplifier is turned off when a current limit is exceeded. One problem with this approach is that using only current sensing may inhibit certain modes of operation which are acceptable, such as a high current for a short period of time. Also, some current sensing techniques do not take into account environmental conditions such as ambient temperature, ventilation, heat sinking, etc. Another problem with this approach relates to the fact that the system only knows the current drawn, which can result in flaws. For example, such a system can not take into account the efficiency of the power amplifier or the true junction temperature of the die. Such a system is also inefficient, since the resistor will dissipate power, thus reducing overall efficiency.

SUMMARY OF THE INVENTION

A power amplifier according to one illustrative embodiment of the invention uses one or more techniques for protecting the power amplifier from damage from high temperatures. In one embodiment, a control circuit changes the operation of the power amplifier depending on one or more temperature thresholds being reached. In one example, the control circuit shuts down the power amplifier in response to the sensed temperature. In another example, the control circuit attempts to reduce the temperature of the power amplifier without shutting down the power amplifier. These two examples can be operated within the same design.

Other features and advantages of the present invention will be apparent from the accompanying drawings and from the detailed description that follows below.

BRIEF DESCRIPTION OF THE DRAWINGS

The present invention is illustrated by way of example and not limited in the figures of the accompanying drawings, in which like references indicate similar elements and in which.

DETAILED DESCRIPTION

In order to provide a context for understanding this description, the following description illustrates one example of a typical application of the present invention. A power amplifier of the present invention may be used for any desired applications, including wireless transmission systems such as mobile or cellular communication devices or other wireless devices. In a wireless device, the wireless device may include a transceiver, an antenna module, and an antenna. Coupled between the transceiver and the antenna module is an RF power amplifier for amplifying signals for transmission via the antenna. In the case of a wireless mobile application, the invention may be applied to GSM, CDMA, PCS, DCS, etc., or any other wireless systems. This is just one example of an application of a power amplifier utilizing the present invention. The invention may also be used in any other application requiring a power amplifier.

Generally, the present invention provides techniques for protecting power amplifiers from temperature extremes resulting from conditions such as load mismatches. In one example, an RF power amplifier is implemented in an integrated circuit. The temperature of the integrated circuit is sensed, and the operation of the RF power amplifier is controlled accordingly. In one example, the power amplifier is shut down when the sensed temperature reaches a threshold value, which can be set to a value just below the point where permanent damage to the integrated circuit would occur. In another example, when a threshold temperature is reached, the operation of the power amplifier is changed, to prevent the temperature of the power amplifier from rising to a level that would damage the integrated circuit. Examples of actions that can be taken include decreasing the output power level of the power amplifier, decreasing the duty cycle of the output of the power amplifier, dropping a call, instructing a user to take corrective measures, etc.

Figure 1:
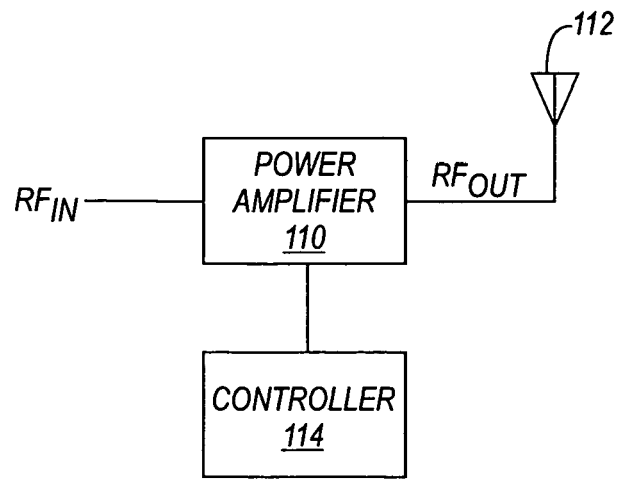
FIG. 1 is a block diagram showing a power amplifier used in a wireless application.

FIG. 1 is a block diagram showing a power amplifier 110 used in a wireless application. The power amplifier 110 receives an RF input signal ($RF_{IN}$) and provides an amplified RF output signal ($RF_{OUT}$) to an antenna 112 for transmission. A controller 114 is coupled to the power amplifier 110 to control the operation of the power amplifier 110. In one example, the controller 114 is an external baseband controller, which controls the operation of the power amplifier 110. In another example, the controller 114 is formed on the same integrated circuit as the power amplifier 110.

As mentioned above, the present invention protects the power amplifier by sensing the temperature of the power amplifier and taking an appropriate action. In one example, two temperature thresholds are established. A first temperature threshold is set as a warning at a point where a thermal fault has not occurred, but where a fault will occur if the temperature continues to rise. For example, the first temperature threshold can be set at a point determined by how fast the power amplifier can be cooled by changing certain conditions in the power amplifier, without having to be shut down. If conditions in the power amplifier can be changed such that the temperature will not continue to rise, then the power amplifier can be protected, without shutting down the power amplifier. A second threshold temperature can be set at a point where a thermal fault has occurred and the power amplifier is shut down. For example, the second threshold temperature can be set just below the temperature where damage would occur. As a result, the power amplifier will shut down before any damage can occur.

Figure 2:
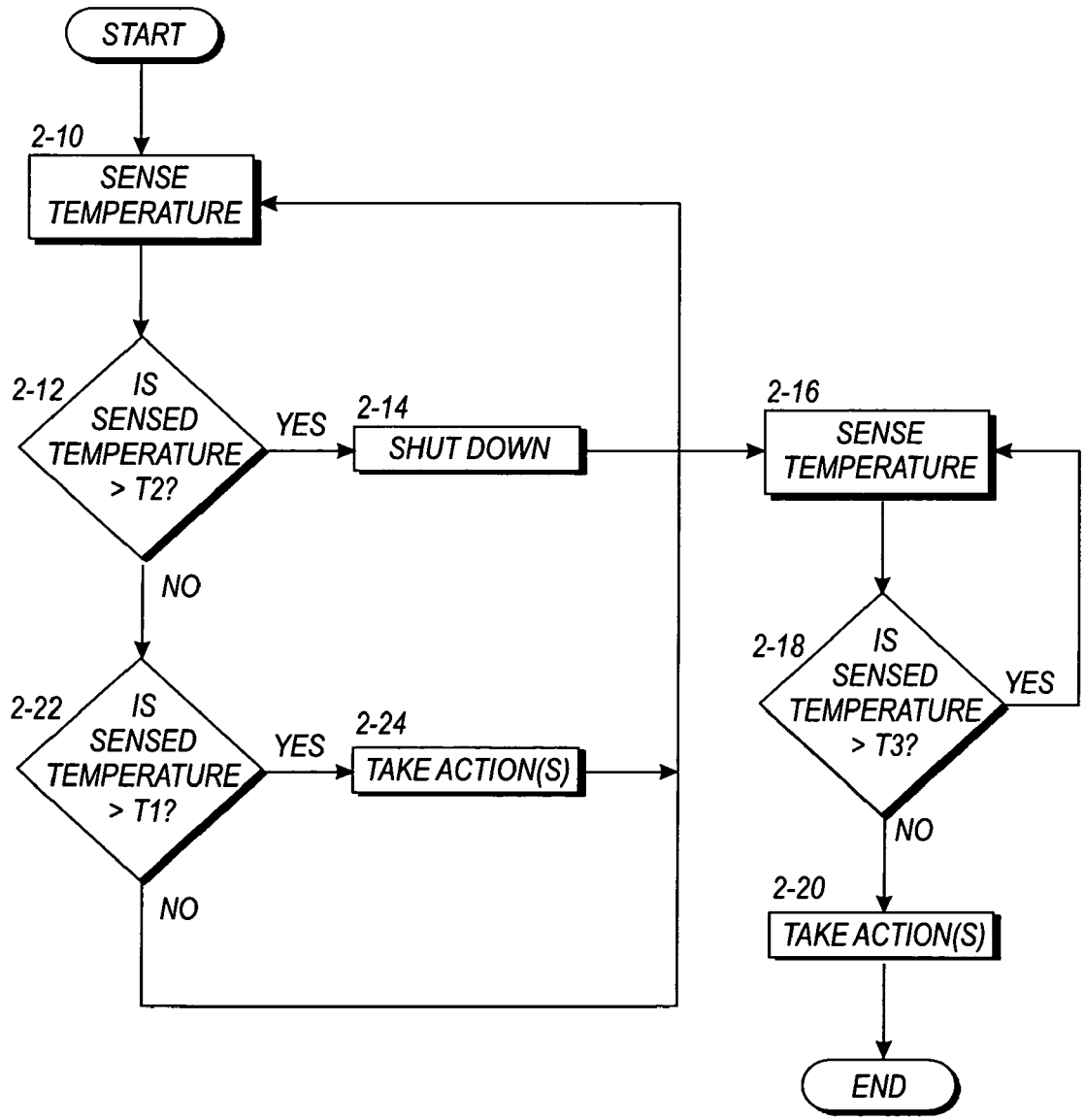
FIG. 2 is a flowchart illustrating one example of the operation of the present invention.

FIG. 2 is a flowchart illustrating one example of the operation of the present invention. The process shown in FIG. 2 begins with step 2-10, where the temperature of the power amplifier is sensed. At step 2-12, the process determines whether the sensed temperature exceeds the threshold temperature T2. In one example, the threshold temperature T2 is established at a point where thermal damage is about to occur if the power amplifier continues to operate. If the sensed temperature exceeds temperature T2, the process proceeds to step 2-14 where the power amplifier is shut down. After the power amplifier is shut down (step 2-14), the temperature is still monitored. At step 2-16, the temperature is sensed. At step 2-18, the process determines whether the sensed temperature exceeds the threshold temperature T3. In one example the threshold temperature T3 corresponds to a temperature where it would be safe to restart the power amplifier. At step 2-18, the process determines whether the sensed temperature still exceeds the threshold temperature T3. If so, then the power amplifier remains shut down, and the temperature is sensed again. When the sensed temperature drops below threshold temperature T3, the process proceeds to step 2-20, where some action is taken. In one example, the power amplifier is enabled. Other examples of actions are also possible. If, at step 2-12, the sensed temperature does not exceed temperature T2, the process proceeds to step 2-22. At step 2-22, the process determines whether the sensed temperature exceeds the threshold temperature T1, which, in this example, is less than threshold temperature T2. In one example, the threshold temperature T1 is established at a point where a fault is about to occur, but where the temperature can be controlled by taking some action. If the sensed temperature exceeds temperature T1, the process proceeds to step 2-24 where action is taken to attempt to prevent the temperature from reaching the temperature threshold T2. Examples of actions (or any combination of actions) that can be taken are described in more detail below. After action is taken, the process goes back to step 2-10, where the temperature is sensed again. If it is determined that the sensed temperature does not exceed temperature T1, the process goes back to step 2-10, where the temperature is sensed again. Note that the determinations outlined in steps 2-12 and 2-22 could occur in any order, or simultaneously. Also, the present invention may only use one temperature threshold, and take action, or shut down the power amplifier accordingly. Similarly, more temperature thresholds can be used.

Figure 3:
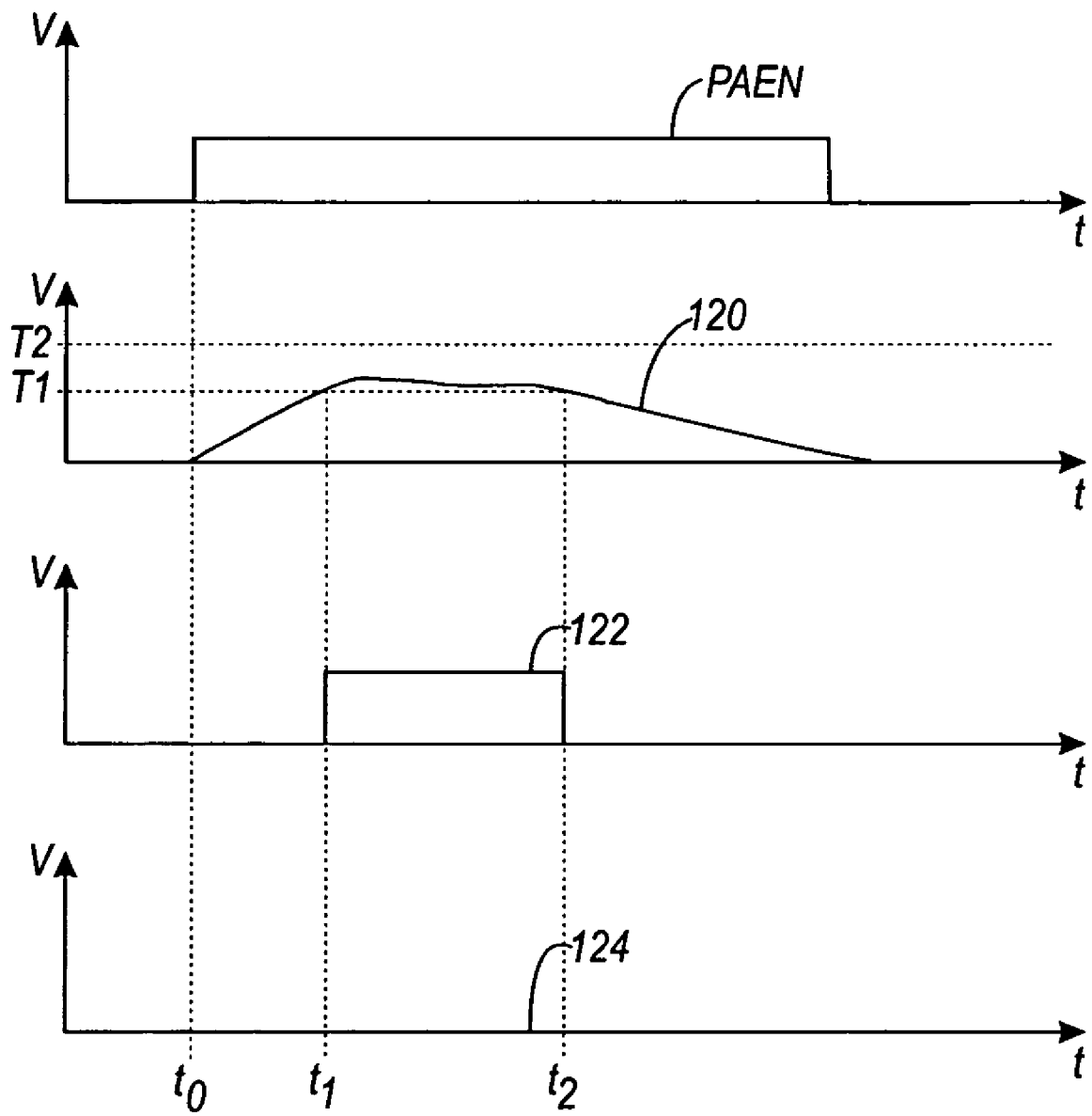
FIGS. 3-5 are timing diagrams illustrating examples of the operation of the invention.
Figure 4:
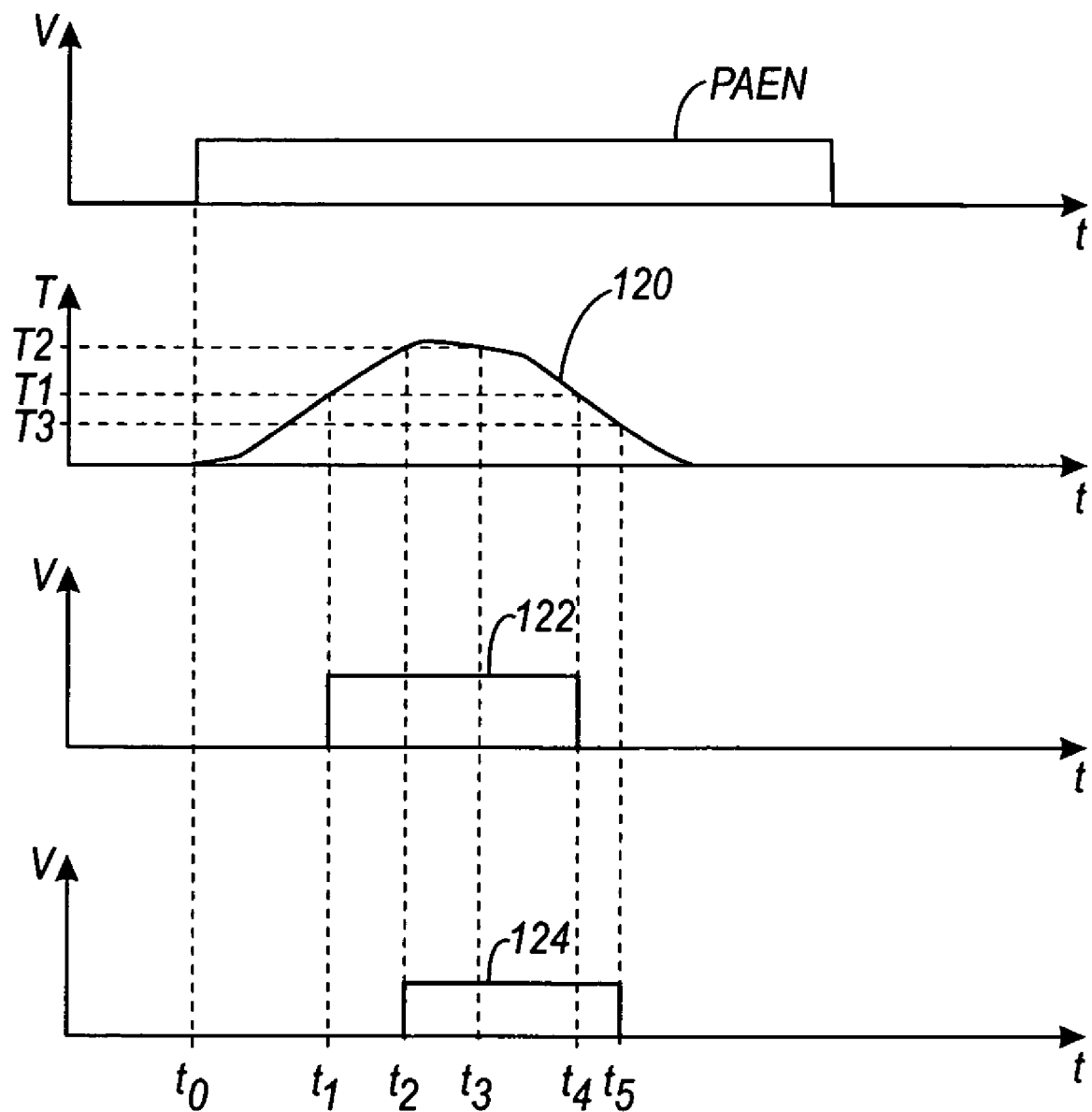

FIGS. 3 and 4 are timing diagrams illustrating examples of the operation of the invention. In the example of FIG. 3, temperature threshold T1 is reached, but temperature threshold T2 is not reached. The first signal shown in FIG. 3 is the external power amplifier enable signal (PAEN), which is high when the power amplifier is being used to amplify the input signal $RF_{IN}$. In FIG. 3, the PAEN is shown going high at time $t_0$. The next signal shown in FIG. 3 is a temperature signal 120, which has a voltage derived from the sensed temperature. As described above, the temperature of the power amplifier is sensed, and compared to threshold temperatures T1 and T2. As shown, the temperature signal 120 reaches threshold temperature T1 at time $t_1$. As a result, a thermal limit signal (TLIMIT) 122 goes high, and one or more actions are taken in an attempt to prevent the temperature from reaching temperature threshold T2. In this example, temperature T2 is not reached. At time $t_2$, the sensed temperature drops below temperature T1, signal 122 goes low, and the power amplifier returns to a normal operating mode.

In the example of FIG. 4, temperature thresholds T1 and T2 are both exceeded. In this example, the temperature threshold T1 is reached at time $t_1$ and signal 122 goes high. At time $t_2$, the sensed temperature reaches temperature threshold T2, and shutdown signal (SHUTD) 124 goes high. When signal 124 goes high, the power amplifier is shut down to prevent the power amplifier from being damaged. As a result, the temperature of the power amplifier decreases. In one example, the power amplifier is reactivated when the temperature drops below threshold temperature T3 at time $t_5$. Signals 122 and 124 can be disabled at different times depending on the application requirements.

Figure 5:
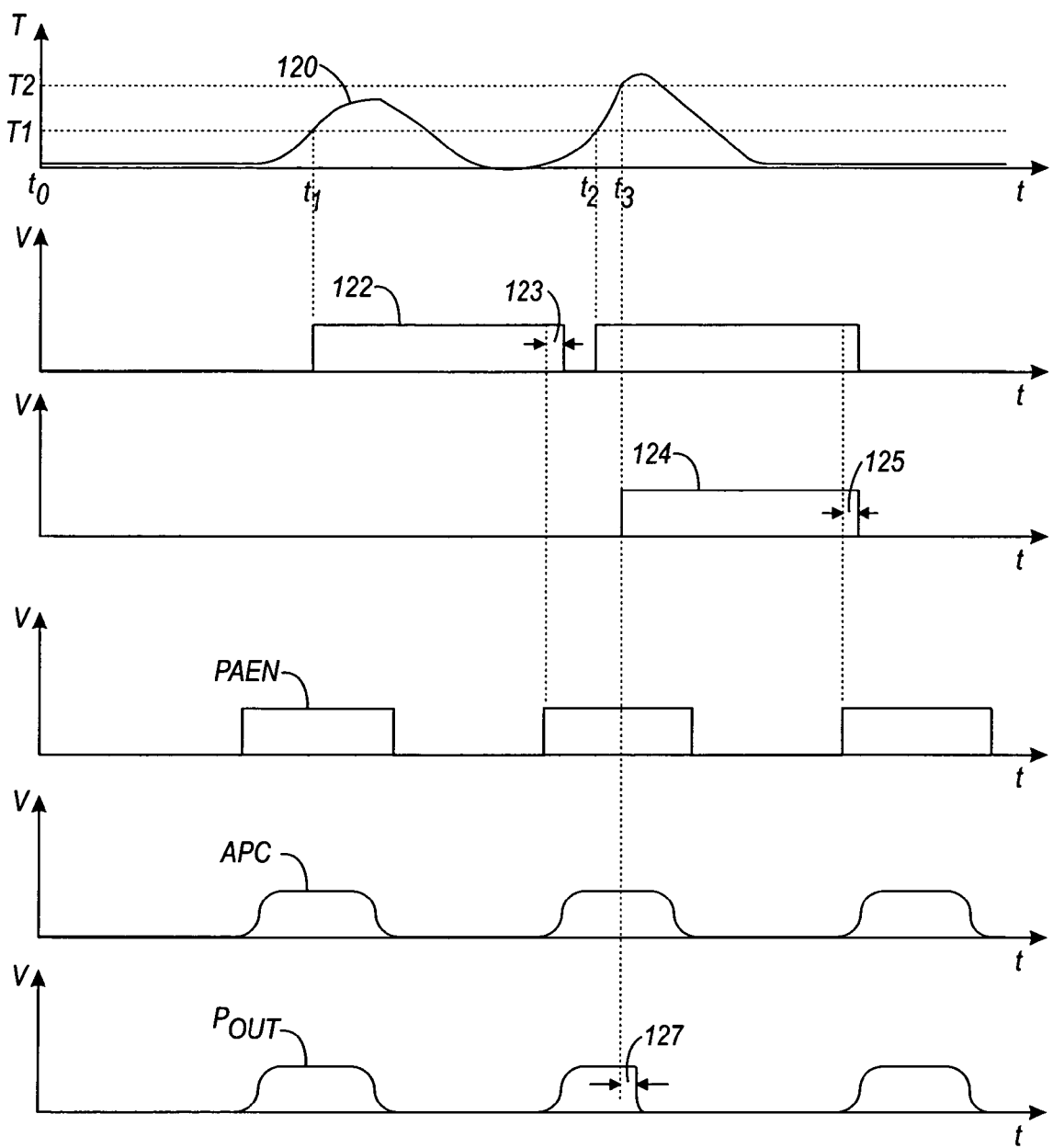

FIG. 5 is another example of a timing diagram illustrating examples of the operation of the invention. In the example of FIG. 5, the power amplifier enable signal (PAEN) is shown through three bursts. FIG. 5 also shows an analog power control signal (APC), which relates to a desired power amplifier output level, and the sensed power amplifier output level ($P_{OUT}$) is also shown. In the example shown in FIG. 5, during the first burst, the temperature signal 120 reaches temperature T1 at time $t_1$. When the temperature signal 120 reaches temperature T1, the thermal limit signal 122 goes high. In this example, the signal 122 stays high until the beginning of the second burst (after a delay 123). At time $t_2$, the temperature signal 120 reaches threshold temperature T1 again. Like during the first burst, the thermal limit signal 122 goes high until the beginning of the next burst. As shown, the temperature signal 120 continues to rise, and exceeds threshold temperature T2 at time $t_3$. When threshold temperature T2 is reached, the shut down signal 124 goes high, causing the power amplifier to shut down. In this example, the signal 124 stays high until the beginning of the next burst (after a delay 125). As shown, the external PAEN signal and the external APC signal remain high during the burst, but the power amplifier output signal $P_{OUT}$ drops after a shutdown delay 127.

Figure 6:
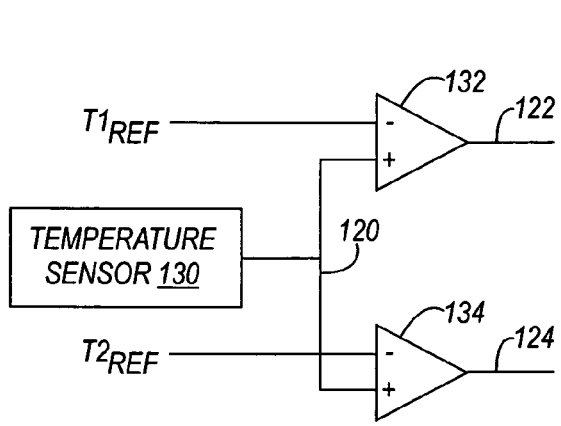
FIG. 6 shows a block diagram of a circuit for sensing the temperature of a power amplifier and generating the control signals.

The present invention may be implemented in any desired way. FIG. 6 shows one example of a block diagram of a circuit sensing the temperature of a power amplifier and generating the control signals 122 and 124 shown in FIGS. 3 and 4. In this example, the temperature of the power amplifier is sensed, and a temperature signal is compared to the threshold temperatures. FIG. 6 shows a temperature sensor 130, which may be comprised of any desired temperature sensing circuit. The temperature sensor 130 generates a temperature signal 120, which is provided to first inputs of first and second comparators 132 and 134. The second input of the comparator 132 is coupled to reference signal $T1_{REF}$, which corresponds to the first temperature threshold T1. The second input of the comparator 134 is coupled to reference signal $T2_{REF}$, which corresponds to the second temperature threshold T2. In this example, reference signals $T1_{REF}$ and $T2_{REF}$ are temperature independent reference signals. An example of the generation of reference signals $T1_{REF}$ and $T2_{REF}$ are described below, with respect to FIG. 7. When the sensed temperature exceeds the first temperature threshold T1, the output of the comparator 132 will go high (signal 122). Similarly, when the sensed temperature exceeds the second temperature threshold T2, the output of the comparator 134 will go high (signal 124).

Figure 7:
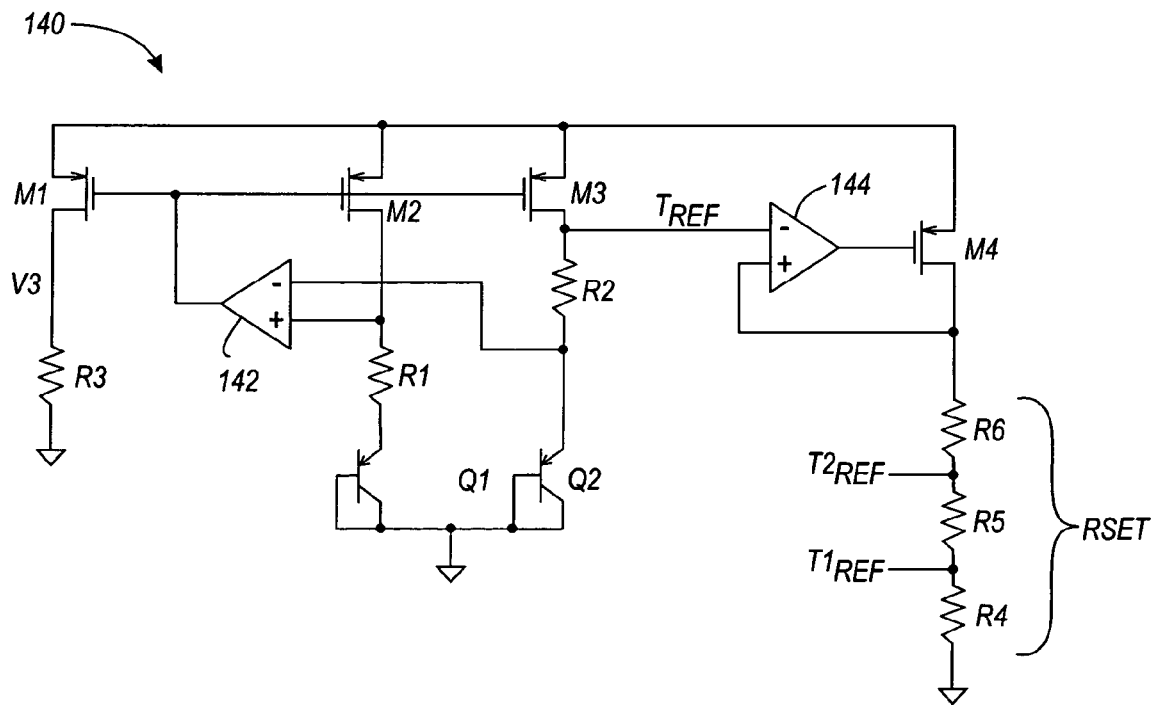
FIG. 7 is a schematic diagram illustrating one example of a bandgap circuit for generating a temperature independent reference signal.

In one example, the temperature reference signals $T1_{REF}$ and $T2_{REF}$ are temperature independent signals having voltages that do not vary significantly with changes in temperature. FIG. 7 is a schematic diagram illustrating one example of a bandgap reference circuit 140 for generating the temperature reference signals. The circuit 140 includes switching devices M1, M2, M3, Q1, and Q2 coupled as shown. In addition, op-amp 142 and resistors R1, R2, and R3 are coupled to the switching devices as shown. In the example shown in FIG. 7, a reference voltage is derived from the bandgap of silicon. In this example, the reference signal is generated by summing voltages with proportional-to-absolute-temperature (PTAT) and complementary-to-absolute-temperature (CTAT) temperature coefficients, such that the resulting voltage $T_{REF}$ is constant with changing temperature. In the example shown in FIG. 7, the reference signal $T_{REF}$ can be represented by the following equation:

$$T_{REF} = V_{BE2} + \frac{R2}{R1} V_T \ln\left(\frac{A1}{A2}\right).$$

$T_{REF}$ is then buffered by op-amp 144 and switching device M4 to set a precision, temperature-independent current in resistor chain $R_{SET}$. The resistor chain $R_{SET}$ includes resistors R4, R5, and R6, which form a voltage divider to set reference signals $T1_{REF}$, $T2_{REF}$ to desired values, which depend on the sizes of the resistors. Note that the reference signals $T1_{REF}$ and $T2_{REF}$ can be generated in other ways as well. In another example, one or more reference signals are provided from an external source (e.g., a specialized reference signal from the controller, a reference derived from the received PAEN (or other) signal, etc.). V3 is a voltage with a PTAT temperature coefficient, and in this example, may be used for temperature sensor 130 of FIG. 6.

Figure 8:
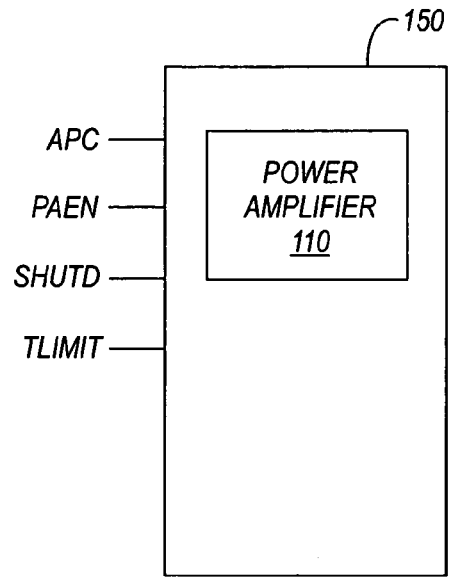
FIG. 8 is a diagram of a power amplifier formed on an integrated circuit.

In one embodiment, a power amplifier of the present invention is formed on an integrated circuit and is controlled by an external controller, such as baseband controller. FIG. 8 is a diagram of a power amplifier 110 formed on an integrated circuit 150. FIG. 8 shows four interface pins PAEN, SHUTD, APC, and TLIMIT. Note that the integrated circuit 150 has additional pins, but they are not shown in FIG. 8. A first pin is labeled PAEN is adapted to receive the power amplifier enable signal from the controller. A second pin is labeled APC and is adapted to receive an analog power control signal. The APC signal controls the output power of the power amplifier. During operation of the power amplifier, the pins labeled SHUTD and TLIMIT provide data to the controller, as described above with respect to FIGS. 3 and 4. In another embodiment, information can be sent to the controller via a digital interface (e.g., a serial interface, etc.) or other interface. In the example of a digital interface, the information sent to the controller could also include the measured temperature, and the controller could perform the comparisons and take the appropriate actions. The integrated circuit can be formed using any desired manufacturing technology, such as CMOS technology.

The controller can be designed to use the information from the pins SHUTD and TLIMIT in any desired manner. In one example, when SHUTD goes high, the power amplifier turns itself off, so the SHUTD signal that the controller receives simply lets the controller know that the power amplifier has been shut down. In another example, the power amplifier does not shut itself down, and relies on the controller to shut down the power amplifier (e.g., by lowering the PAEN signal or the APC signal) after receiving the SHUTD signal from the power amplifier. The controller may use information from the TLIMIT signal in many ways. For example, the controller can take a number of actions that should help to lower the temperature of the power amplifier. Examples of actions include reducing the output power, reducing the duty cycle, shutting down the power amplifier, dropping the call, renegotiating communication parameters with a base station, etc. In another example, the controller can convey a message to a user (e.g., an audible message, visual message, etc. instructing a user to take corrective action) when the controller believes a problem can be addressed by the user. For example, when it is possible that a load mismatch is caused by a large metallic object positioned near the antenna, the controller could instruct the user to move away from the object.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A circuit comprising:
an RF power amplifier;
a temperature sensor for sensing the temperature of the RF power amplifier; and
a control circuit, wherein the control circuit generates a first digital control signal and changes the operation of the RF power amplifier in response to the sensed temperature reaching a first threshold value, and wherein the control circuit generates a second digital control signal that shuts down the power amplifier in response to the sensed temperature reaching a second threshold value, wherein the second threshold value is higher than the first threshold value.

2. The circuit of claim 1, wherein the RF power amplifier generates an output signal, and wherein the control circuit decreases the power of the output signal in response to the sensed temperature reaching the first threshold value.

3. The circuit of claim 1, wherein the RF power amplifier generates an output signal having a duty cycle, and wherein the control circuit decreases the duty cycle in response to the sensed temperature reaching the first threshold value.

4. The circuit of claim 1, wherein the circuit is used in a mobile communication system, wherein the control circuit drops a call in response to the first threshold value being reached.

5. The circuit of claim 1, wherein the control circuit conveys a message to a user of the circuit in response to the sensed temperature reaching the first threshold value.

6. The circuit of claim 5, wherein the message instructs the user to move the circuit.

7. The circuit of claim 1, wherein the control circuit determines whether the sensed temperature reaches the first threshold value by comparing a temperature dependent signal with a reference signal.

8. The circuit of claim 7, wherein the reference signal is a temperature independent signal.

9. The circuit of claim 7, further comprising a bandgap reference circuit, wherein the reference signal is derived from the bandgap reference circuit.

10. The circuit of claim 1, wherein the circuit is formed on an integrated circuit.

11. The circuit of claim 1, wherein the circuit is formed on a complementary metal oxide semiconductor (CMOS) integrated circuit.

12. A circuit comprising:
an RF power amplifier for generating an RF output signal;
a temperature sensor for sensing the temperature of the RF power amplifier; and
control circuitry coupled to the temperature sensor for comparing one or more temperature dependent signals with first and second reference signals, wherein the control circuitry determines when the sensed temperature reaches a first threshold temperature and when the sensed temperature reaches a second threshold temperature based on the comparisons, wherein the control circuitry generates a first digital control signal and takes a first action when the sensed temperature reaches the first threshold temperature, and wherein the control circuitry generates a second digital control signal that causes the RF power amplifier to shut down when the sensed temperature reaches the second threshold temperature.

13. The circuit of claim 12, wherein the first action involves decreasing the power level of the RF output signal.

14. The circuit of claim 12, wherein the first action involves conveying a message to a user of the circuit.

15. The circuit of claim 12, wherein the first and second reference signals are temperature independent signals.

16. The circuit of claim 15, further comprising a first bandgap reference circuit, wherein the first reference signal is derived from the bandgap reference circuit.

17. The circuit of claim 16, further comprising a second bandgap reference circuit, wherein the second reference signal is derived from the bandgap reference circuit.

18. The circuit of claim 12, wherein the RF power amplifier is formed on an integrated circuit.

19. The circuit of claim 12, wherein the circuit is formed on a complementary metal oxide semiconductor (CMOS) integrated circuit.

20. An integrated circuit comprising:
an RF power amplifier circuit formed on the integrated circuit for generating an RF output signal;
a temperature sensor formed on the integrated circuit for sensing the temperature of the integrated circuit; and
a control circuit, wherein the control circuit generates a first digital control signal and takes a first action to reduce the temperature of the RF power amplifier when the sensed temperature reaches a first threshold temperature, and wherein the control circuit generates a second digital control signal that causes the RF power amplifier to shut down when the sensed temperature reaches a second threshold temperature, and wherein the second threshold temperature is greater than the first threshold temperature.

21. The integrated circuit of claim 20, wherein the power level of the RF output signal is decreased in response to a sensed temperature reaching the first threshold value.

22. The integrated circuit of claim 20, wherein the duty cycle of the RF output signal is decreased in response to a sensed temperature reaching the first threshold value.

23. The integrated circuit of claim 20, wherein the control circuit determines whether the sensed temperature reaches the first threshold value by comparing a temperature dependent signal with a first reference signal.

24. The integrated circuit of claim 23, wherein the reference signal is a temperature independent signal.

25. The integrated circuit of claim 23, wherein the control circuit determines whether the sensed temperature reaches the second threshold value by comparing the temperature dependent signal with a second reference signal.

26. The integrated circuit of claim 23, wherein the first reference signal is provided as an input to the integrated circuit.

27. The integrated circuit of claim 26, wherein the first reference signal is provided by a baseband controller.

28. The integrated circuit of claim 20, further comprising a bandgap reference circuit.

29. The integrated circuit of claim 28, wherein the bandgap reference circuit generates a temperature independent reference signal.

30. The integrated circuit of claim 29, wherein the control circuit determines whether a sensed temperature reaches the threshold value by comparing a temperature dependent signal with the temperature independent reference signal generated by the bandgap reference circuit.

31. The integrated circuit of claim 20, wherein the integrated circuit is formed on a complementary metal oxide semiconductor (CMOS) device.

* * * * *